United States Patent
Young et al.

(10) Patent No.: US 9,404,174 B2
(45) Date of Patent: Aug. 2, 2016

(54) PINNED TARGET DESIGN FOR RF CAPACITIVE COUPLED PLASMA

(71) Applicant: APPLIED MATERIALS, INC., Santa Clara, CA (US)

(72) Inventors: Donny Young, San Jose, CA (US); Alan A. Ritchie, Menlo Park, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 440 days.

(21) Appl. No.: 13/799,014

(22) Filed: Mar. 13, 2013

(65) Prior Publication Data

US 2013/0186751 A1 Jul. 25, 2013

Related U.S. Application Data

(63) Continuation-in-part of application No. 13/327,689, filed on Dec. 15, 2011, now Pat. No. 8,702,918.

(51) Int. Cl.
*H01J 37/34* (2006.01)
*C23C 14/34* (2006.01)

(52) U.S. Cl.
CPC .............. *C23C 14/34* (2013.01); *C23C 14/3407* (2013.01); *H01J 37/3408* (2013.01); *H01J 37/3411* (2013.01); *H01J 37/3435* (2013.01); *H01J 37/3441* (2013.01)

(58) Field of Classification Search
CPC H01J 37/3411; H01J 37/3435; H01J 37/3441
See application file for complete search history.

(56) References Cited

U.S. PATENT DOCUMENTS

| 5,658,442 | A | | 8/1997 | Van Gogh et al. |
| 5,676,803 | A | | 10/1997 | Demaray et al. |
| 5,736,021 | A | | 4/1998 | Ding et al. |
| 5,863,397 | A | * | 1/1999 | Tu et al. ............... 204/298.12 |
| 6,143,147 | A | | 11/2000 | Jelinek |
| 6,149,776 | A | | 11/2000 | Tang et al. |
| 6,149,784 | A | | 11/2000 | Su et al. |

(Continued)

FOREIGN PATENT DOCUMENTS

EP 0 841 683 A2 5/1998
KR 10-1999-0075642 A 10/1999

OTHER PUBLICATIONS

"Spirol Ground Hallow Dowels" 2010 Spirol International Corporation 2.5M Sep. 2010.

(Continued)

*Primary Examiner* — Keith Hendricks
*Assistant Examiner* — Timon Wanga
(74) *Attorney, Agent, or Firm* — Moser Taboada; Alan Taboada

(57) ABSTRACT

In some embodiments, substrate processing apparatus may include a chamber body; a lid disposed atop the chamber body; a target assembly coupled to the lid, the target assembly including a target of material to be deposited on a substrate; an annular dark space shield having an inner wall disposed about an outer edge of the target; a seal ring disposed adjacent to an outer edge of the dark space shield; and a support member coupled to the lid proximate an outer end of the support member and extending radially inward such that the support member supports the seal ring and the annular dark space shield, wherein the support member provides sufficient compression when coupled to the lid such that a seal is formed between the support member and the seal ring and the seal ring and the target assembly.

11 Claims, 5 Drawing Sheets

(56) References Cited

U.S. PATENT DOCUMENTS

| | | |
|---|---|---|
| 7,981,262 B2 | 7/2011 | Pavloff et al. |
| 2004/0020759 A1 | 2/2004 | Lawson et al. |
| 2004/0251130 A1* | 12/2004 | Liu et al. .................. 204/298.01 |
| 2007/0295602 A1* | 12/2007 | Tiller et al. .............. 204/298.11 |
| 2009/0308732 A1 | 12/2009 | Cao et al. |
| 2011/0070740 A1* | 3/2011 | Bettencourt ........ H01J 37/3244 438/710 |
| 2011/0240464 A1 | 10/2011 | Rasheed et al. |
| 2011/0240466 A1 | 10/2011 | Ritchie et al. |

OTHER PUBLICATIONS

International Search Report and Written Opinion mailed Mar. 20, 2013 for PCT Application No. PCT/US2012/069435.

Search Report from the State Intellectual Property Office of the People's Republic of China dated Sep. 18, 2015 for China Application No. 201280063717X.

\* cited by examiner

US 9,404,174 B2

PINNED TARGET DESIGN FOR RF CAPACITIVE COUPLED PLASMA

CROSS-REFERENCE TO RELATED APPLICATIONS

This application is a continuation-in-part of co-pending U.S. patent application Ser. No. 13/327,689, filed Dec. 15, 2011, which is herein incorporated by reference.

FIELD

Embodiments of the present invention generally relate to physical vapor deposition processing equipment.

BACKGROUND

In a physical vapor deposition (PVD) chamber, a dark space region exists between a powered electrode, such as the sputtering target, and a grounded shield disposed proximate the target's edge, referred to as a dark space shield. In an existing PVD chamber, the dark space shield is typically mounted to the main body of the PVD chamber, separately from the target. The target is typically mounted on a removable lid of the PVD chamber and then lowered onto the chamber body for processing. However, the inventors have discovered that such a configuration may undesirably result in the dark space shield and the target being inaccurately aligned.

The inventors have further discovered that as the frequency of radio frequency (RF) energy applied to the target increases, the dark space region becomes more critical to controlling any plasma irregularity and arc events, which may negatively affect the quality of deposition in the PVD chamber.

Accordingly, the inventors have provided improved apparatus for PVD processing.

SUMMARY

Methods and apparatus for physical vapor deposition are provided. In some embodiments, a chamber body; a lid disposed atop the chamber body; a target assembly coupled to the lid, the target assembly including a target of material to be deposited on a substrate; an annular dark space shield having an inner wall disposed about an outer edge of the target; a seal ring disposed adjacent to an outer edge of the dark space shield; and a support member coupled to the lid proximate an outer end of the support member and extending radially inward such that the support member supports the seal ring and the annular dark space shield, wherein the support member provides sufficient compression when coupled to the lid such that a seal is formed between the support member and the seal ring and the seal ring and the target assembly.

In some embodiments, an apparatus for physical vapor deposition may include a lid configured to be movable coupled to a substrate process chamber; a target assembly coupled to the lid, the target assembly including a target of material to be deposited on a substrate; an annular dark space shield having an inner wall disposed about an outer edge of the target; a support member coupled to the lid proximate an outer end of the support member and extending radially inward, the support member including a feature that, when the support member is coupled to the lid, biases the annular dark space shield against the target assembly; and a seal ring disposed adjacent to an outer edge of the dark space shield and between the support member and the target assembly, wherein the support member provides sufficient compression when coupled to the lid such that a seal is formed between the support member and the seal ring and the seal ring and the target assembly.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
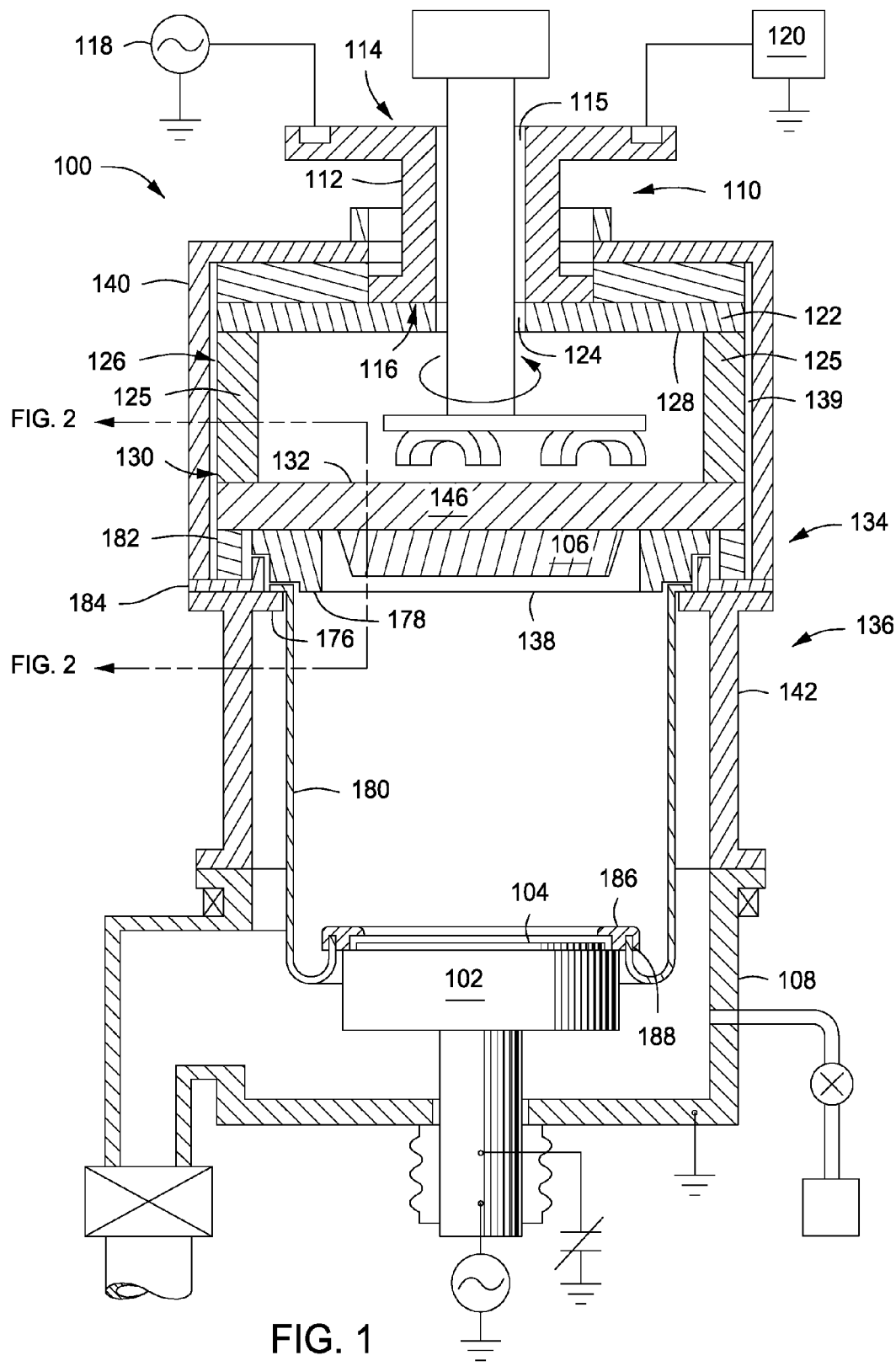
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for improved physical vapor deposition processing equipment are provided herein. FIG. 1 depicts a schematic, cross-sectional view of a physical vapor deposition chamber, or process chamber 100 in accordance with some embodiments of the present invention. Examples of suitable PVD chambers include the ENDURA® PVD processing chamber, commercially available from Applied Materials, Inc., of Santa Clara, Calif. Other processing chambers from Applied Materials, Inc. or other manufactures may also benefit from the inventive apparatus disclosed herein.

In some embodiments, the process chamber 100 has a chamber lid 134 disposed atop a chamber body 136. The chamber lid 134 can be removed from the chamber body 136, for example, to install or replace a target or for performing maintenance on the process chamber 100. In some embodiments, the chamber lid includes a target assembly 138, a dark space shield 178, a seal ring 182, and a support member 184 for supporting the dark space shield 178 and seal ring 182. In some embodiments, a feed structure 110 may be coupled to the chamber lid 134 to couple RF and, optionally, DC power to the target.

In some embodiments, the target assembly 138 comprises a target 106 and a target backing plate 146. The target 106 comprises a material to be deposited on the substrate 104 during sputtering, such as a metal or metal oxide. In some embodiments, the backing plate 146 may comprise a conductive material, such as copper-zinc, copper-chrome, or the same material as the target, such that RF and DC power can be coupled to the target 106 via the backing plate 146. Alternatively, the backing plate 146 may be non-conductive and may include conductive elements (not shown) such as electrical feedthroughs or the like.

The support member 184 may be coupled to the chamber lid 134 to support one or more components of the chamber, such as the seal ring 182 and the dark space shield 178. The support member 184 may be a generally planar member having a central opening to accommodate the dark space shield 178 and the target 106. In some embodiments, the support member 184 may be circular, or disc-like in shape, although the shape may vary depending upon the corresponding shape of the chamber lid and/or the shape of the substrate to be processed in the process chamber 100. In use, when the chamber lid 134 is opened or closed, the support member 184 maintains the dark space shield 178 in proper alignment with respect to the target 106, thereby minimizing the risk of misalignment due to chamber assembly or opening and closing the chamber lid 134.

In some embodiments, the support member 184 may be coupled to the chamber lid 134 proximate an outer peripheral edge of the support member 184 and extends radially inward to support the seal ring 182 and the dark space shield 178. The seal ring 182 may be a ring or other annular shape having a desired cross-section. The seal ring may include two opposing planar and generally parallel surfaces to facilitate interfacing with the support member 184 on one side of the seal ring 182 and the target backing plate 146 on the other side of the seal ring 182. The seal ring 182 may be made of a dielectric material, such as ceramic.

The dark space shield 178 is generally disposed about an outer edge of the target 106. In some embodiments, the seal ring 182 is disposed adjacent to an outer edge of the dark space shield 178 (i.e., radially outward of the dark space shield 178). In some embodiments, the dark space shield 178 is made of a dielectric material, such as ceramic. By providing a dielectric dark space shield 178, arcing between the dark space shield and adjacent components that are RF hot may be avoided or minimized. Alternatively, in some embodiments, the dark space shield 178 is made of a conductive material, such as stainless steel, aluminum, or the like. By providing a conductive dark space shield 178 a more uniform electric field may be maintained within the process chamber 100, thereby promoting more uniform processing of substrates therein. In some embodiments, a lower portion of the dark space shield 178 may be made of a conductive material and an upper portion of the dark space shield 178 may be made of a dielectric material.

Figure 2:
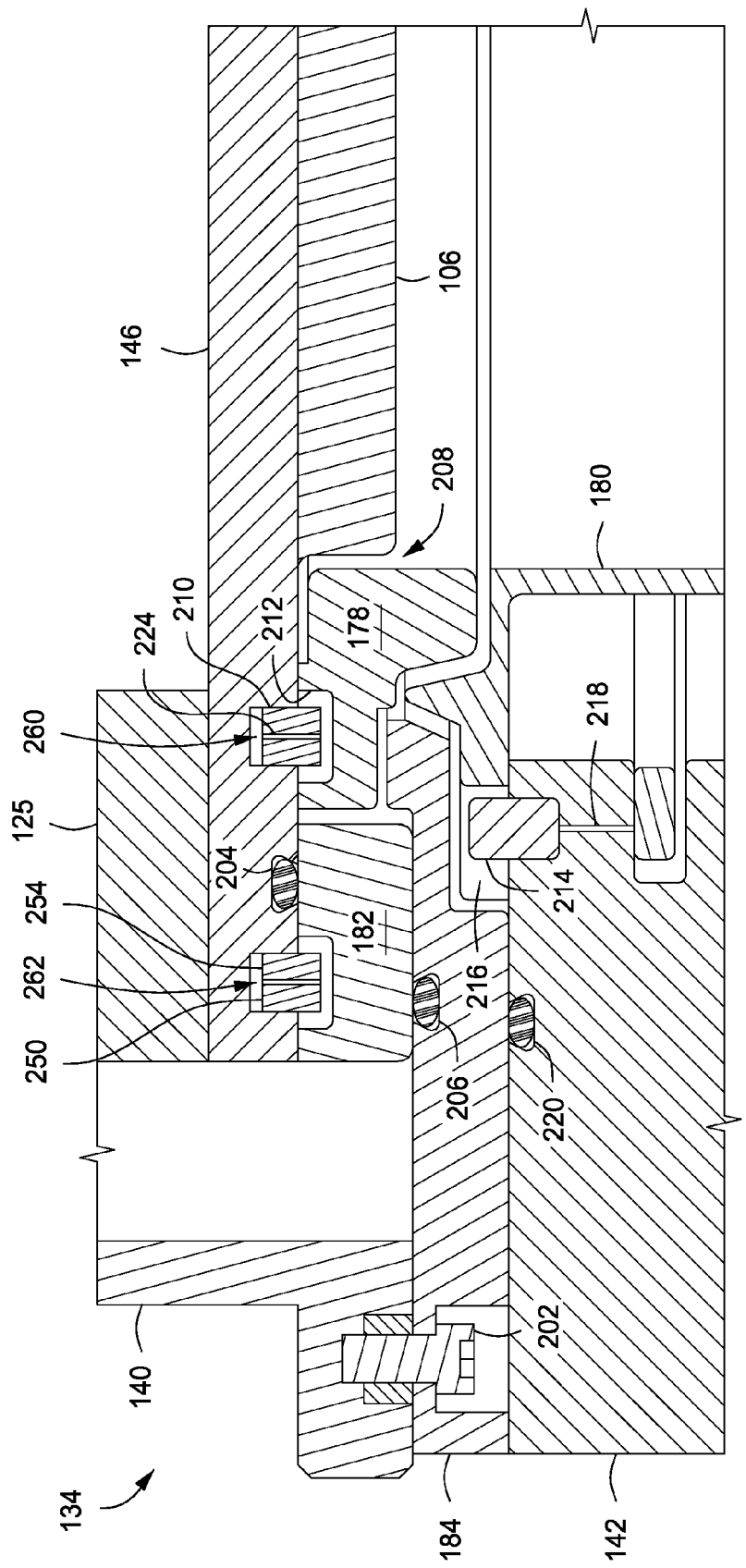
FIG. 2 depicts a sectional view of a support member and surrounding structure in accordance with some embodiments of the present invention.
Figure 4:
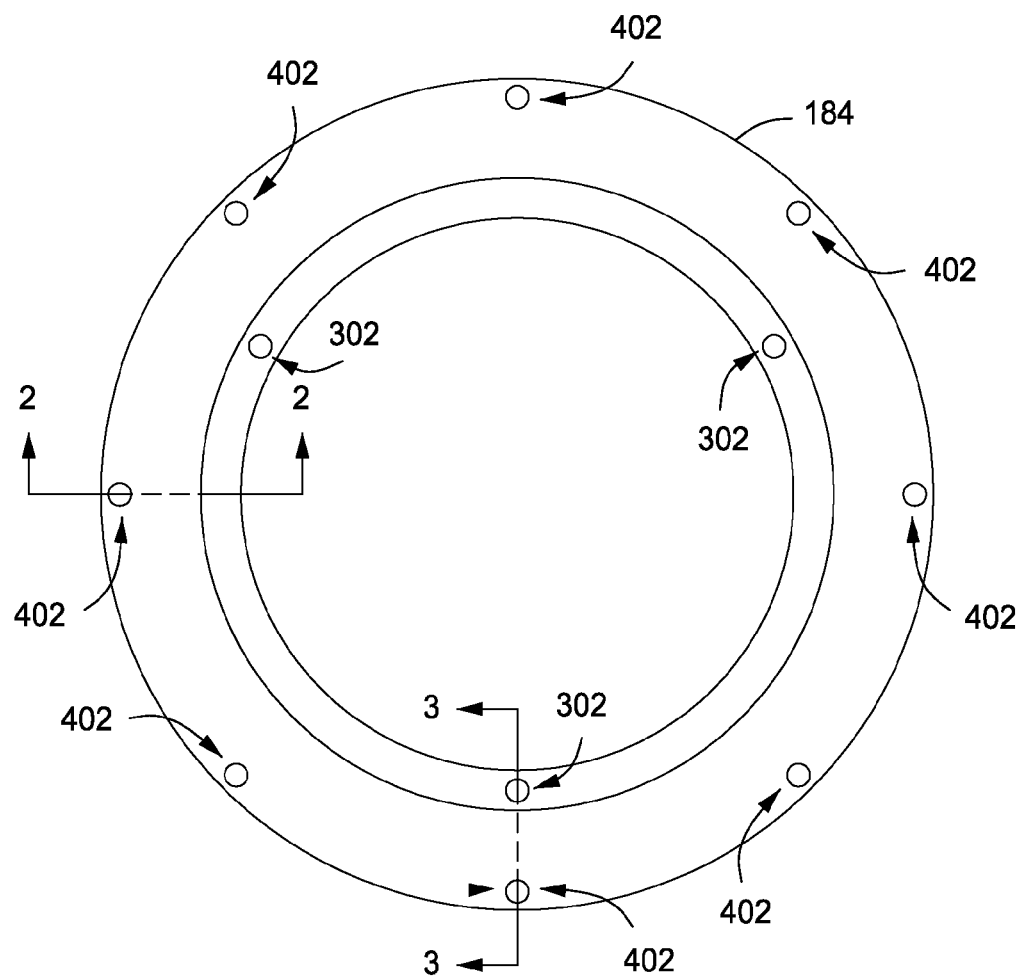
FIG. 4 depicts a sectional top view of a support member in accordance with some embodiments of the present invention.

FIG. 2 depicts a more detailed view of the support member 184 and surrounding structure of the process chamber 100 of FIG. 1. In some embodiments, the support member 184 is coupled to the chamber lid 134 proximate an outer periphery of the support member 184. In some embodiments, the support member 184 is coupled to the chamber lid 134 by a plurality of fasteners 202 such as bolts, or the like. For example, FIG. 4 depicts a top view of the support member 184 having a plurality of openings 402 distributed about the outer periphery to facilitate the bolts 202 shown in FIG. 2. Although eight openings 402 are shown, greater or fewer fasteners may be used depending upon the configuration of the chamber lid and the support member.

When coupled to the chamber lid 134, the support member 184 facilitates forming a seal between portions of the process chamber 100 that are not held at vacuum (such as within the lid) and portions of the process chamber 100 that may be held at vacuum (such as within the interior of the process chamber 100). For example, a seal 204 may be disposed between the seal ring 182 and the target backing plate 146, and a seal 206 may be disposed between the seal ring 182 and the support member 184 such that, when the support member 184 is installed, sufficient force is applied to compress the seals 204, 206 to form a vacuum seal at those locations. Seals 204, 206, as well as other seals discussed herein, may be any suitable seal, such as an o-ring, a gasket, or the like. For example, a seal 220 may be provided between the support member 184 and the upper chamber adapter 142 to provide a seal between the chamber lid 134 and the upper chamber adapter 142 when the chamber lid 134 is in a closed position atop the upper chamber adapter 142.

In some embodiments, alignment features may be provided to maintain a gap 208 between the inner wall of the dark space shield 178 and the outer edge of the target 106. The alignment features may facilitate maintaining a more uniform gap and may prevent contact or near contact of the dark space shield 178 and the target 106 that may undesirably lead to arcing. In some embodiments, the radial gap is in the range of 0.003 to 0.030 inches. In some embodiments, a plurality of inner pins 210 may extend from a bottom surface of the target backing plate 146. For example, the pins may be press fit or otherwise secured with corresponding holes 260 formed in the target backing plate 146. The inner pins 210 include portions that extend in a substantially normal direction from the bottom surface of the target backing plate 146 to interface with, or fit into, a corresponding plurality of slots 212 disposed within a top surface of the dark space shield 178. In some embodiments, there are at least three sets of alignment features (e.g., three inner pins 210 and three slots 212) that prevent the side-to-side movement of the dark space shield 178 and the maintain the gap 208 between the inner wall of the dark space shield 178 and the outer edge of the target 106. The slots 212 may be radially aligned such that a radial length of the slot 212 is greater than the diameter of the inner pins 210 to facilitate relative movement of the dark space shield 178 and the target backing plate 146 due to differences in rates of thermal expansion and contraction, while maintaining alignment between the dark space shield 178 and the target backing plate 146. In some embodiments, each inner pin 210 may have a hollow passageway 224 disposed axially through the inner pin 210 to allow evacuation of gases trapped within the alignment features.

In some embodiments, a plurality of outer pins 250 may be disposed radially outward from the plurality of inner pins 210 near the periphery of the target back plate 146, and extend from a bottom surface of the target backing plate 146. For example, the pins 250 may be press fit or otherwise secured with corresponding holes 262 formed in the target backing plate 146. The outer pins 250 include portions that extend in a substantially normal direction from the bottom surface of the target backing plate 146 to interface with, or fit into, a corresponding plurality of slots 252 disposed within a top surface of the seal ring spacer 182. In some embodiments, these additional alignment features (e.g., three outer pins 250 and three slots 252) further prevent the side-to-side movement of the dark space shield 178 and the maintain the gap 208 between the inner wall of the dark space shield 178 and the outer edge of the target 106 in conjunction with the three inner pins 210 and three slots 212. The slots 252 may be radially aligned such that a radial length of the slot 252 is greater than the diameter of the outer pins 250 to facilitate relative movement of the dark space shield 178 and the target backing plate 146 due to differences in rates of thermal expansion and contraction, while maintaining alignment between the dark space shield 178 and the target backing plate 146. In some embodiments, each outer pin 250 may have a hollow passageway 254 disposed axially through the outer pin 250 to allow evacuation of gases trapped within the alignment features.

In some embodiments, the inner and outer pins 210, 250 may be secured in holes 260, 262 such that a top portion of the pins 210, 250 extend outward from about 0.05 inches to about 0.5 inches from a bottom surface of backing plate 146. In some embodiments, the inner and outer pins 210, 250 have a total height from about 0.1 inches to about 0.5 inches. In some embodiments, the inner and outer pins 210, 250 may be cylindrical and have a diameter from about 0.1 inches to about 0.5 inches.

Figure 5:
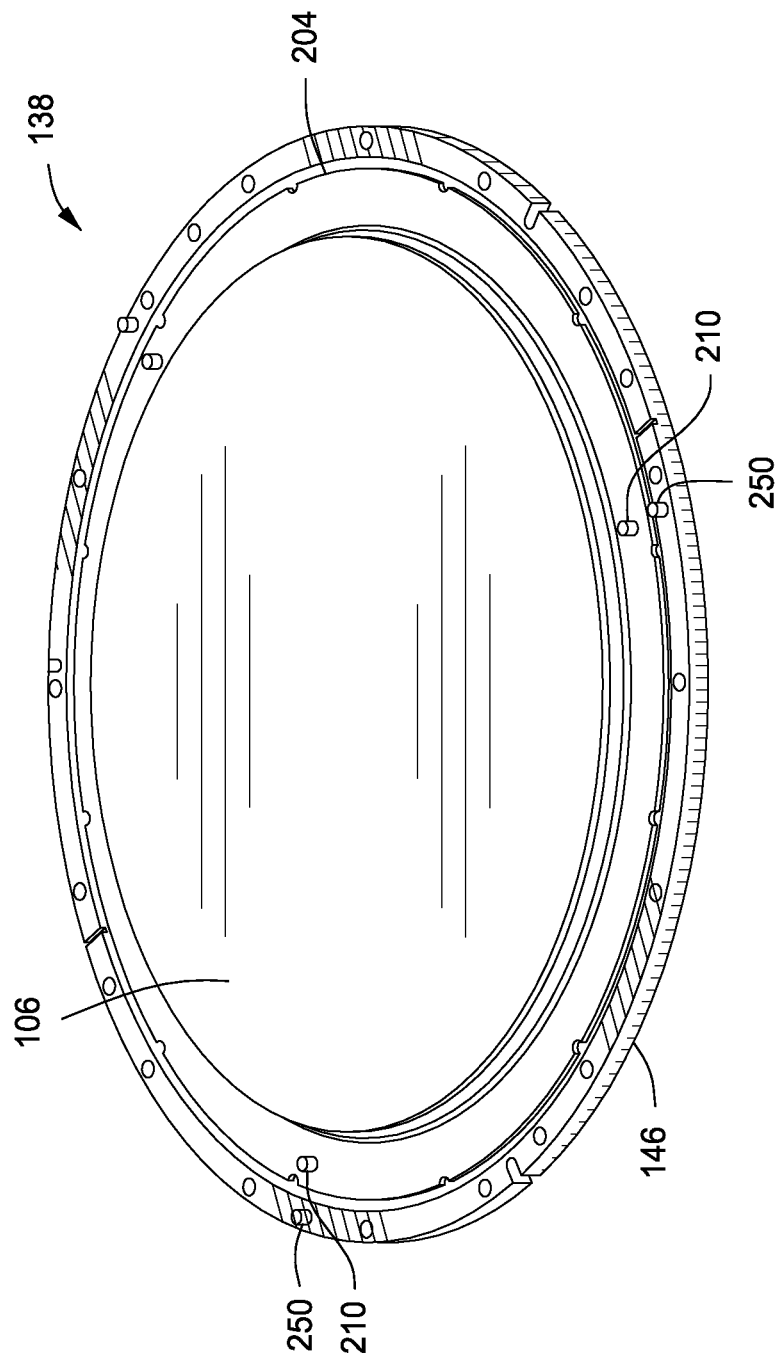
FIG. 5 depicts an isometric view of a target assembly in accordance with some embodiments of the present invention.

FIG. 5 is an isometric view of target assembly 138 in accordance with at least one embodiment of present invention. As shown in FIG. 5, in some embodiments inner pins 210 and outer pins 250 may be disposed equidistantly from each other.

Figure 3:
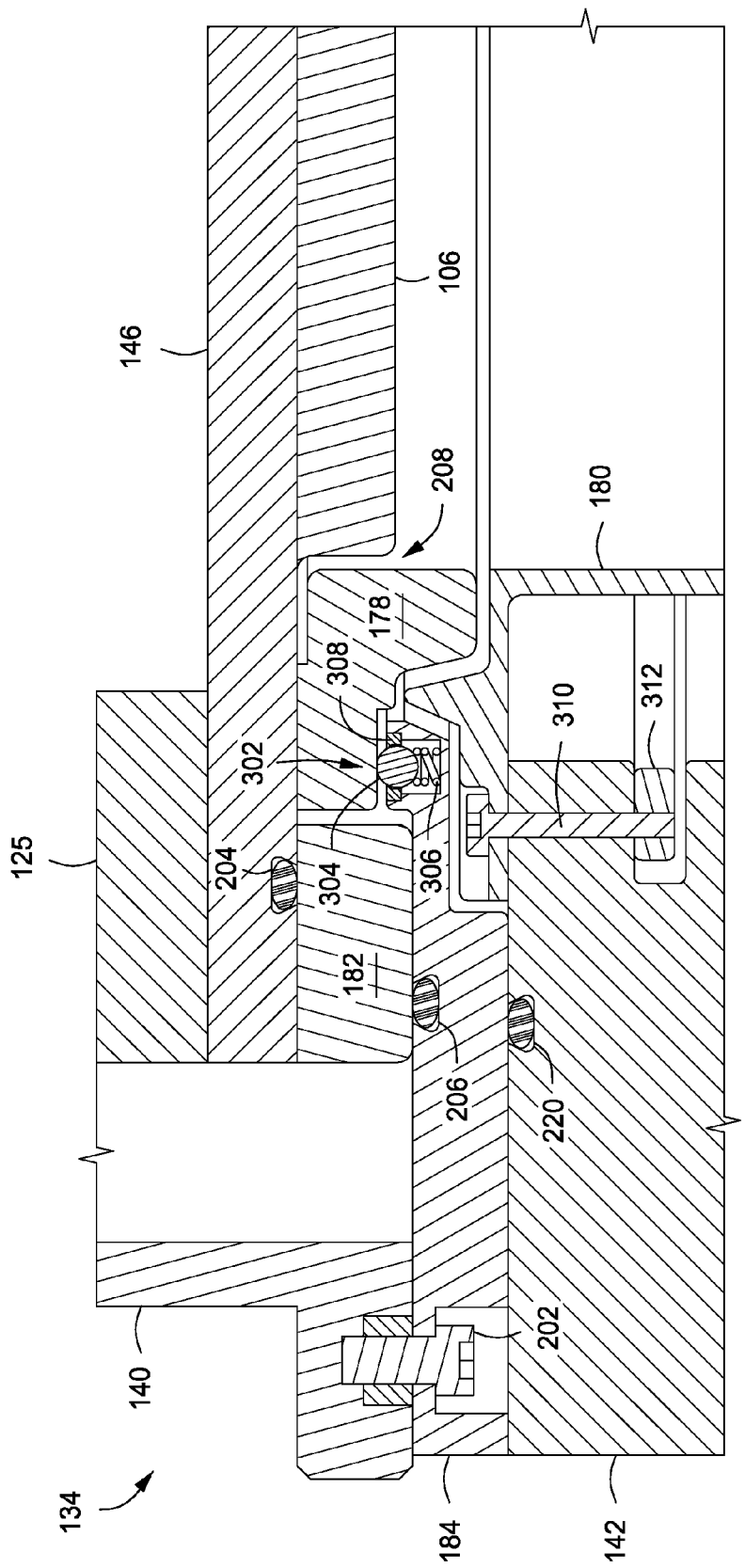
FIG. 3 depicts a sectional view of a support member and surrounding structure in accordance with some embodiments of the present invention.

In embodiments where the dark space shield 178 is a dielectric, the support member 184 may include a plurality of biasing features that bias the dark space shield 178 against the target assembly 138. For example, as depicted in FIG. 3, a biasing feature 302 may include a ball 304 retained in a recess in the support member 184. A spring 306 may be disposed between the ball 304 and a bottom of the recess to bias the ball 304 away from the bottom of the recess. A retaining feature, such as a retaining ring 308 may be secured to the support member 184 to retain the ball 304 within the recess. The diameter of the retaining ring 308 may be selected to allow a desired portion of the ball 304 to extend from the recess and contact the dark space shield 178 while retaining the ball 304 within the recess of the support member 184. Furthermore, by allowing radial movement by moving over the balls 304, particle generation due to rubbing between components may be reduced or eliminated.

Returning to FIG. 1, in some embodiments, the feed structure 110 couples RF and, optionally, DC energy to the target 106. Although a particular feed structure 110 is described below, other feed structures having other configurations may also be utilized. In some embodiments, the feed structure 110 may include a body 112 having a first end 114 that can be coupled to an RF power source 118 and, optionally, a DC power source 120, which can be respectively utilized to provide RF and DC energy to the target 106. A second end 116 of the feed structure 110, opposite the first end 114, is coupled to the chamber lid 134. In some embodiments, the body 112 further includes a central opening 115 disposed through the body 112 from the first end 114 to the second end 116. The feed structure 110 may be fabricated from suitable conductive materials to conduct the RF and DC energy from the RF power source 118 and the DC power source 120.

In some embodiments, the chamber lid 134 may further include a source distribution plate 122 to distribute the energy applied via the feed structure 110 to the peripheral edge of the target 106 via a conductive member 125. As such, in some embodiments, the second end 116 of the body 112 may be coupled to the source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A ground shield 140 may be provided to cover the outside surfaces of the chamber lid 134. The ground shield 140 may be coupled to ground, for example, via the ground connection of the chamber body 136. In some embodiments, the ground shield 140 may have a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

The chamber body 136 contains a substrate support pedestal 102 for receiving a substrate 104 thereon. The substrate support pedestal 102 may be located within a grounded enclosure wall 108, which may be a chamber wall (as shown) or a grounded shield. The ground shield 140 may covering at least some portions of the chamber 100 above the target 106.

In some embodiments, the chamber body 134 may further include a grounded bottom shield 180 connected to a ledge 176 of an upper chamber adapter 142. The bottom shield 180 extends downwardly and may include a generally tubular portion having a generally constant diameter. The bottom shield 180 extends along the walls of the upper chamber adapter 142 and the chamber wall 108 downwardly to below a top surface of the substrate support pedestal 102 and returns upwardly until reaching a top surface of the substrate support pedestal 102. A cover ring 186 rests on the top of the upwardly extending inner portion 188 of the bottom shield 180 when the substrate support pedestal 102 is in its lower, loading position but rests on the outer periphery of the substrate support pedestal 102 when it is in its upper, deposition position to protect the substrate support pedestal 102 from sputter deposition.

The bottom shield 180 may have an inner diameter, or central opening, that is substantially the same as an inner diameter, or corresponding central opening, of the dark space shield 178, thereby providing a more uniform processing window for the plasma formed in the process chamber 100. In some embodiments, a plurality of alignment features may be provided to maintain the bottom shield 180 in a desired position. For example, as shown in FIG. 2, in some embodiments, a plurality of pins 214 may extend from a surface of the upper chamber adapter 142. For example, the pins may be press fit or otherwise secured with corresponding holes formed in the upper chamber adapter 142. The pins 214 include portions that extend in a substantially normal direction from the surface of the upper chamber adapter 142 to interface with, or fit into, a corresponding plurality of slots 216 disposed within the bottom shield 180. In some embodiments, there are at least three sets of alignment features (e.g., three pins 214 and three slots 216) that prevent the side-to-side movement of the bottom shield 180 and the maintain the alignment of the bottom shield 180 and the dark space shield 178. The slots 216 may be radially aligned such that a radial length of the slot 216 is greater than the diameter of the pins 214 to facilitate relative movement of the bottom shield 180 and the upper chamber adapter 142 due to differences in rates of thermal expansion and contraction, while maintaining alignment between the bottom shield 180 and the dark space shield 178. In some embodiments, a passageway 218 may be provided through the upper chamber adapter to prevent trapping of gases when installing the pins 214. In some embodiments, one or more fasteners may be provided to secure the bottom shield 180 to the upper chamber adapter 142. For example, as shown in FIG. 3, a fastener, such as a bolt 310 may be provided through a corresponding hole disposed in the upper chamber adapter 142. In some embodiments, a ring 312 may be disposed in a recess in the upper chamber adapter 142 in line with the bolts 310. The bolts 310 may be threaded into the ring 312 to clamp the bottom shield 180 to the upper chamber adapter 142.

Thus, apparatus for enabling concentricity of plasma dark space are provided herein. The inventive apparatus advantageously allows for improved gap control between the dark space shield and the target and for improved concentricity of the plasma dark space region.

While the foregoing is directed to embodiments of the present invention, other and further embodiments of the invention may be devised without departing from the basic scope thereof.

The invention claimed is:

1. A substrate processing apparatus, comprising:
   a target assembly, the target assembly including:
      a backing plate having a first side and an opposing second side;
      a target material bonded to the first side of the backing plate;
      a plurality of inner pins coupled to the first side of the backing plate and having portions extending in a substantially normal direction from the first side of the backing plate; and
      a plurality of outer pins coupled to the first side of the backing plate and having portions extending in a substantially normal direction from the first side of the backing plate, wherein the plurality of outer pins are disposed radially outward from the plurality of inner pins;
   an annular dark space shield having an inner wall disposed about an outer edge of the target assembly, wherein the annular dark space shield includes one or more alignment features that are aligned with and configured to receive the extending portions of the plurality of inner pins; and
   a seal ring disposed about an outer edge of the dark space shield and spaced apart from the dark space shield, wherein the seal ring includes one or more alignment features that are aligned with and configured to receive the extending portions of the plurality of outer pins.

2. The substrate processing apparatus of claim 1, wherein the one or more alignment features of the annular dark space shield include a plurality of shield slots formed on a top surface of the dark space shield and configured to receive the extending portions of the plurality of inner pins.

3. The substrate processing apparatus of claim 1, wherein the one or more alignment features of the seal ring include a plurality of seal ring slots formed on a top surface of the seal ring and configured to receive the extending portions of the plurality of outer pins.

4. The substrate processing apparatus of claim 1, wherein the plurality of inner pins are disposed radially outward from the target material.

5. The substrate processing apparatus of claim 1, wherein each of the plurality of inner pin is radially aligned with a corresponding outer pin.

6. The substrate processing apparatus of claim 1, wherein the backing plate includes a plurality of inner holes formed radially outward of the target material on the first side of the backing plate, and wherein each of the plurality of inner pins are secured in a corresponding inner hole.

7. The substrate processing apparatus of claim 6, wherein the backing plate includes a plurality of outer holes formed radially outward of the plurality of inner holes on the first side of the backing plate, and wherein each of the plurality of outer pins are secured in a corresponding outer hole.

8. The substrate processing apparatus of claim 7, wherein the plurality of inner pins are press fit into the corresponding plurality of inner holes, and the plurality of outer pins are press fit into the corresponding plurality of outer holes.

9. The substrate processing apparatus of claim 1, further comprising:
   a support member that supports the seal ring and the annular dark space shield, wherein the support member provides sufficient force to cause a seal to be formed between the support member and the seal ring and the seal ring and the target assembly.

10. The substrate processing apparatus of claim 1, wherein the plurality of inner pins and the plurality of outer pins extend outward from the first side of the backing plate from about 0.1 inches to about 0.2 inches.

11. A substrate processing apparatus, comprising:
    a chamber body;
    a lid disposed atop the chamber body;
    a target assembly coupled to the lid, the target assembly including a backing plate having a first side and an opposing second side;
       a target material bonded to the first side of the backing plate;
       a plurality of inner pins coupled to the first side of the backing plate and having portions extending in a substantially normal direction from the first side of the backing plate; and
       a plurality of outer pins coupled to the first side of the backing plate and having portions extending in a substantially normal direction from the first side of the backing plate, wherein the plurality of outer pins are disposed radially outward from the plurality of inner pins;
    an annular dark space shield having an inner wall disposed about an outer edge of the target assembly, wherein the annular dark space shield includes one or more alignment features that are aligned with and configured to receive the extending portions of the plurality of inner pins;
    a seal ring disposed about an outer edge of the dark space shield and spaced apart from the dark space shield, wherein the seal ring includes one or more alignment features that are aligned with and configured to receive the extending portions of the plurality of outer pins; and
    a support member coupled to the lid proximate an outer end of the support member and extending radially inward such that the support member supports the seal ring and the annular dark space shield, wherein the support member provides sufficient compression when coupled to the lid such that a seal is formed between the support member and the seal ring and the seal ring and the target assembly.

* * * * *